United States Patent
Mikami et al.

(10) Patent No.: US 9,317,080 B2
(45) Date of Patent: Apr. 19, 2016

(54) LOCAL COOLING UNIT AND COOLING SYSTEM

(75) Inventors: Teruo Mikami, Tokyo (JP); Tomohiro Yoshida, Tokyo (JP); Masakatsu Senda, Kounosu (JP); Ryoji Shimokawa, Higashimurayama (JP); Yasuhiro Kashirajima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1100 days.

(21) Appl. No.: 13/101,202

(22) Filed: May 5, 2011

(65) Prior Publication Data

US 2011/0279976 A1 Nov. 17, 2011

(30) Foreign Application Priority Data

May 11, 2010 (JP) ................. 2010-109700

(51) Int. Cl.
  F25D 23/12 (2006.01)
  F25D 21/06 (2006.01)
  G06F 1/20 (2006.01)
  H05K 7/20 (2006.01)

(52) U.S. Cl.
  CPC .................. *G06F 1/20* (2013.01); *G06F 1/206* (2013.01); *H05K 7/20745* (2013.01)

(58) Field of Classification Search
  USPC .............. 62/259.1, 259.2, 261, 263, 271, 285
  See application file for complete search history.

(56) References Cited

U.S. PATENT DOCUMENTS

| | | | |
|---|---|---|---|
| 4,958,504 A * | 9/1990 | Ichikawa et al. ............. | 62/259.1 |
| 6,105,383 A * | 8/2000 | Reimann et al. ................ | 62/285 |
| 6,125,924 A | 10/2000 | Lin | |
| 6,867,967 B2 * | 3/2005 | Mok .............................. | 361/695 |
| 7,800,900 B1 * | 9/2010 | Noteboom et al. ........... | 62/259.2 |
| 2001/0054493 A1 | 12/2001 | Hatanaka | |
| 2004/0148948 A1 * | 8/2004 | Kameyama et al. ......... | 62/259.2 |
| 2010/0041327 A1 | 2/2010 | Desler | |
| 2010/0064714 A1 | 3/2010 | Tashiro | |

FOREIGN PATENT DOCUMENTS

| | | |
|---|---|---|
| DE | 29908492 U1 | 9/1999 |
| JP | 08-135996 | 5/1996 |

(Continued)

OTHER PUBLICATIONS

European Office Action in corresponding Application No. 11165649.2, mailed Sep. 5, 2013.

(Continued)

*Primary Examiner* — Mohammad M Ali
*Assistant Examiner* — Daniel C Comings
(74) *Attorney, Agent, or Firm* — Jones Robb, PLLC

(57) ABSTRACT

The local cooling unit according to an aspect of the present invention includes a housing having a cavity formed in the housing, an air inlet port which is provided in a bottom surface of the housing and which takes in exhaust heat air from the electronic device, an evaporator which is provided in the housing and which evaporates a refrigerant by heat exchange with air sucked in from the air inlet port to cool the air, the refrigerant passing through an inside of the evaporator, an air outlet port which is provided in a side surface of the housing and which exhausts the air cooled by the evaporator, and a fan which is provided on a side of the air inlet port or a side of the air outlet port of the housing and which moves the air from the air inlet port to the air outlet port.

8 Claims, 4 Drawing Sheets

(56) References Cited

FOREIGN PATENT DOCUMENTS

| | | | | |
|---|---|---|---|---|
| JP | 11159817 A | * | 6/1999 | ................ F24F 7/06 |
| JP | 2002-156136 | | 5/2002 | |
| JP | 2003-139351 | | 5/2003 | |
| JP | 2003-148838 | | 5/2003 | |
| JP | 2005-164211 | | 6/2005 | |
| JP | 2008-209065 | | 9/2008 | |
| JP | 2009-193246 | | 8/2009 | |
| JP | 2009-287869 | | 12/2009 | |
| JP | 2010-025451 | | 2/2010 | |
| JP | 2010-72697 | | 4/2010 | |
| KR | 10-2010-0013312 | | 2/2010 | |
| WO | WO 2008/003981 | | 1/2008 | |
| WO | WO 2008/150566 | | 12/2008 | |

OTHER PUBLICATIONS

Corresponding Chinese Patent Office Action in Appln. No. 201110107975.0, dated Aug. 2, 2013, with English language translation thereof.

Office Action in Corresponding Japanese Application No. 2010-109700, dated Aug. 19, 2013, and English translation thereof.

Office Action in connection with Corresponding Japanese Patent Application No. 2010-109700, mailed Mar. 20, 2014 and a partial English language translation thereof.

Communication in connection with corresponding foreign Chinese Application No. 201110107975.0, mailed Apr. 21, 2014.

Communication [5 pgs., in Chinese] in connection with corresponding foreign Chinese Application No. 201110107975.0, mailed Oct. 31, 2014 [with English language translation, 10pgs.].

* cited by examiner

LOCAL COOLING UNIT AND COOLING SYSTEM

BACKGROUND OF THE INVENTION

1. Field of the Invention

The present invention relates to a local cooling unit and a cooling system, and particularly, to a local cooling unit and a cooling system for locally cooling an electronic device, such as a computer and a server, which is placed in a server room.

2. Description of the Related Art

In recent years, with improvement in information processing techniques and development of Internet environments, the information processing amount which is required has increased. Data processing centers for processing various kinds of information in large volume are in the spotlight as businesses. For example, in a server room of a data processing center, a number of electronic devices such as computers and servers are installed in a concentrated state, and are continuously operated night and day. Generally, for installation of electronic devices in a server room, a rack mount method is employed. The rack mount method is a method for stacking racks, which house electronic devices by dividing the electronic devices according to the functional unit, on a cabinet in layers. A number of such cabinets (server racks) are arranged and disposed on the floor of a server room. These electronic devices which process information have rapidly improved in processing speed and processing capability. Thus, the heat generation amount from the electronic devices continues to increase.

As a cooling system for cooling electronic devices, there is known a cooling system including a plurality of racks which house electronic devices opposed to each other with a predetermined space (passage) interposed therebetween in a device room, and an air conditioner spaced apart in the predetermined space between the racks.

In such a cooling system, the air conditioner discharges a cooled air downward. Air for cooling is delivered to the predetermined space and sucked into the racks. Then, the cooled air is warmed by cooling the devices housed in the racks, and is blown out from the rear surfaces of the racks.

In the cooling system described above, however, a part of the exhaust heat air from the racks is not delivered to the air conditioner but is sucked into the racks, with the result that the exhaust heat air may recirculate.

Japanese Patent Application Laid-Open No. 2010-25451 discloses that a partition plate which is extendable/retractable in the height direction of racks is installed to prevent recirculation of exhaust heat air from the racks.

SUMMARY OF THE INVENTION

In the cooling system disclosed in Japanese Patent Application Laid-Open No. 2010-25451, a plurality of racks provided in a device room are cooled by an air conditioner. Accordingly, the power of the air blower of the air conditioner is large, and the power consumption increases. In addition, the air conditioner is installed in the device room, which limits the space for arranging the racks.

The present invention has been made in view of the above circumstances, and has an object to provide a local cooling unit and a cooling system which have a small power consumption and are capable of securing a space for arranging racks in a device room.

An aspect of the present invention provides a local cooling unit which is disposed above an electronic device to cool the electronic device, the local cooling unit including: a housing having a cavity formed in the housing; an air inlet port which is provided in a bottom surface of the housing and which takes in exhaust heat air from the electronic device; an evaporator which is provided in the housing and which evaporates a refrigerant by heat exchange with air sucked in from the air inlet port to cool the air, the refrigerant passing through an inside of the evaporator; an air outlet port which is provided in a side surface of the housing and which exhausts the air cooled by the evaporator; and a fan which is provided on a side of the air inlet port or a side of the air outlet port of the housing and which moves the air from the air inlet port to the air outlet port.

According to the present invention, exhaust heat air from an electronic device is locally cooled, so that the exhaust heat air can be cooled with small power (energy). Since the local cooling unit is disposed above the electronic device, a space for arranging the racks can be secured. The exhaust heat air is taken in from the bottom surface side of the housing and the cooled air is exhausted to the side surface side of the housing, thereby enabling downsizing of the local cooling unit itself.

According to other aspect of the present invention, it is preferable that, in the local cooling unit, the evaporator is disposed to be tilted so that the evaporator gradually increases in height toward the air outlet port from the air inlet port.

According to other aspect of the present invention, it is preferable that the local cooling unit further includes a drainage pan formed below the evaporator.

Another aspect of the present invention provides a cooling system for an electronic device, including: a device room; a plurality of rack rows constituted by a plurality of racks, the plurality of racks being disposed in the device room to house the electronic device; and a plurality of local cooling units according to any one of the above aspects, the plurality of local cooling units being disposed above the racks, wherein the plurality of racks have air suction ports and air exhaust ports, the air suction ports being formed in front surfaces of the plurality of racks, the air exhaust ports being formed in rear surfaces of the plurality of racks, and are disposed so that the air exhaust ports oppose each other with a predetermined space interposed therebetween, and the plurality of local cooling units cover the space.

An upper part of the space to which the exhaust heat air is exhausted is covered with the plurality of local cooling units, thereby preventing recirculation of a part of the exhaust heat air from the racks. Further, the exhaust heat exhausted to the space can be efficiently taken in by the local cooling units.

According to other aspect of the present invention, it is preferable that the cooling system further include: a cooling device which is provided at a place higher than the local cooling units and which liquefy an evaporated refrigerant; a gas piping which delivers the refrigerant evaporated by the evaporator to the cooling device; and a liquid piping which delivers the refrigerant liquefied by the cooling device to the evaporator, and that the cooling system circulate the refrigerant naturally.

The refrigerant is circulated by a natural circulation method, thereby suppressing occurrence of condensation on the surface of the evaporator.

According to other aspect of the present invention, it is preferable that, in the cooling system, the device room include a lattice ceiling and that the local cooling units be mounted to the lattice ceiling.

As described above, the local cooling unit and the cooling system according to the present invention have a small power consumption and are capable of secure a space for arranging racks in the device room.

DETAILED DESCRIPTION OF THE PREFERRED EMBODIMENTS

Preferred embodiments of a local cooling unit and a cooling system according to the present invention will now be described in detail in accordance with the accompanying drawings.

In this embodiment, as one example of an electronic device, an example of a server placed in a server room will be described.

Figure 1:
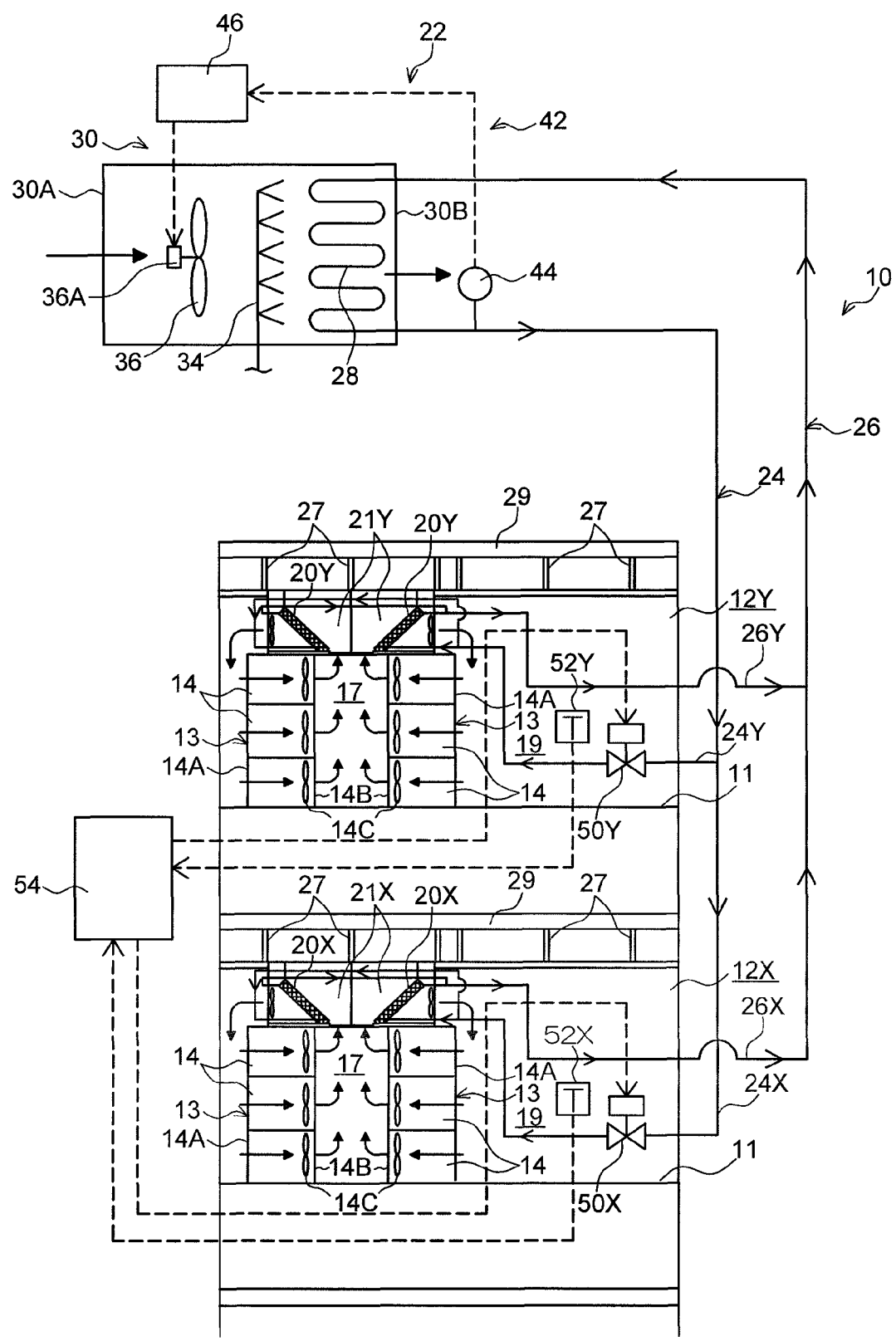
FIG. 1 is a conceptual view illustrating an overall structure of a cooling system of the present invention.

FIG. 1 is a conceptual view illustrating an overall structure of a cooling system 10.

The cooling system 10 shown in FIG. 1 is a cooling system which locally cools hot air discharged from servers 14 provided in upper and lower server rooms 12X and 12Y in a two-storied building. The cooling system 10 has a structure as described below.

In the following description, reference character X, which is added to reference numerals, designates members involved in a cooling system for the server room 12X on the lower floor, and reference character Y, which is added to reference numerals, designates members involved in a cooling system for the server room 12Y on the upper floor.

Figure 2:
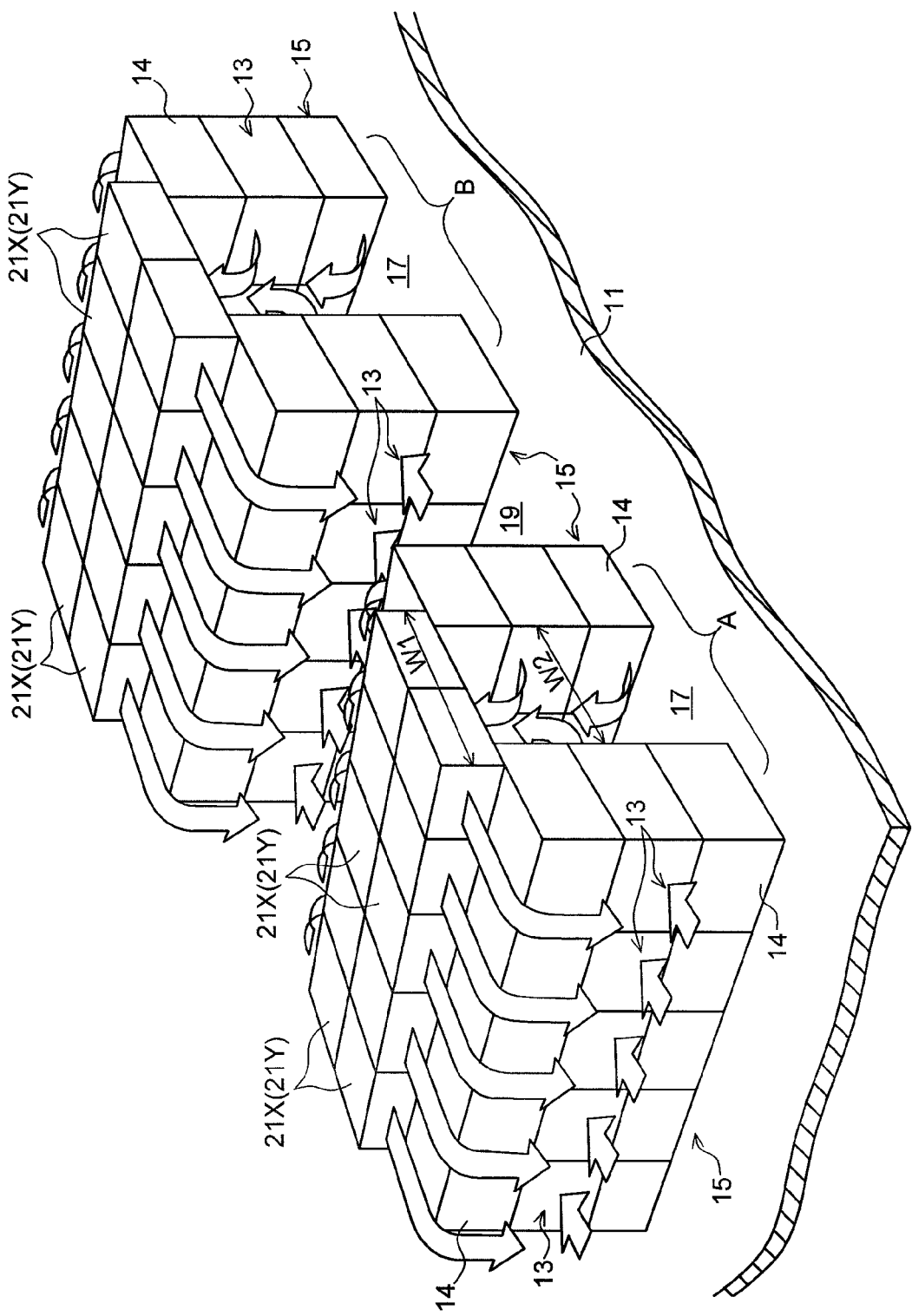
FIG. 2 is an explanatory view illustrating a layout of server racks which house servers stacked in layers, and a layout of local cooling units.

As shown in FIG. 2, on floor surfaces 11 of the server rooms 12X and 12Y, a plurality of (five in FIG. 2) server racks 13 (five server racks in FIG. 2) are laterally aligned to thereby form each rack row 15. The plurality of rack rows 15 are arranged in parallel to each other at predetermined intervals. Though four rack rows 15 are illustrated in FIG. 2, a number of rack rows 15 are provided in the actual server rooms 12X and 12Y. The server racks 13 house the plurality of servers 14 stacked in layers (three layers in FIG. 2).

As shown in FIG. 1, each of the servers 14, which are housed and stacked in layers in the server racks 13, includes an air suction port 14A, an air exhaust port 14B, and a fan 14C formed inside. By driving the fan 14C, air from the suction port 14A is sucked, and exhaust heat air with exhaust heat of each server 14 is exhausted from the exhaust port 14B. This allows each server 14 to be cooled.

As shown in FIG. 2, the plurality of rack rows 15 are divided into a pair of adjacent groups A and B. Further, the servers 14 housed in the rack rows 15 of the same group A or B are housed so that the exhaust ports 14B face each other (see FIG. 1). As a result, an exhaust space 17 to which the exhaust heat air from the servers 14 is exhausted is formed between the rack rows 15 of the same group A or B. Additionally, an air suction space 19 in which air is sucked into the servers 14 is formed between the adjacent groups A and B.

Thus, when the exhaust heat air from the servers 14 is exhausted to the exhaust space 17, the temperature of the exhaust space 17 rises. With the rise of the temperature of the exhaust space 17, the room temperature of the entire server rooms 12X and 12Y rises. Accordingly, the temperature of the suction space 19 also rises. As a result, the temperature of the air sucked into the servers 14 rises, so that a failure of the servers 14 is likely to occur. For this reason, it is necessary to efficiently cool the exhaust heat air exhausted to the exhaust space 17.

In view of this, the embodiment of the present invention provides a structure in which an upper part of the exhaust space 17 is covered with a plurality of local cooling units 21X and 21Y so as to prevent the exhaust heat air from spreading over the entire server rooms 12X and 12Y, and in which the exhaust heat air exhausted to the exhaust space 17 is locally cooled by the local cooling units 21X and 21Y.

A description is now given of the structure of the local cooling units 21X and 21Y and a ceiling suspension structure for covering the upper part of the exhaust space 17 with the local cooling units 21X and 21Y.

Figure 3:
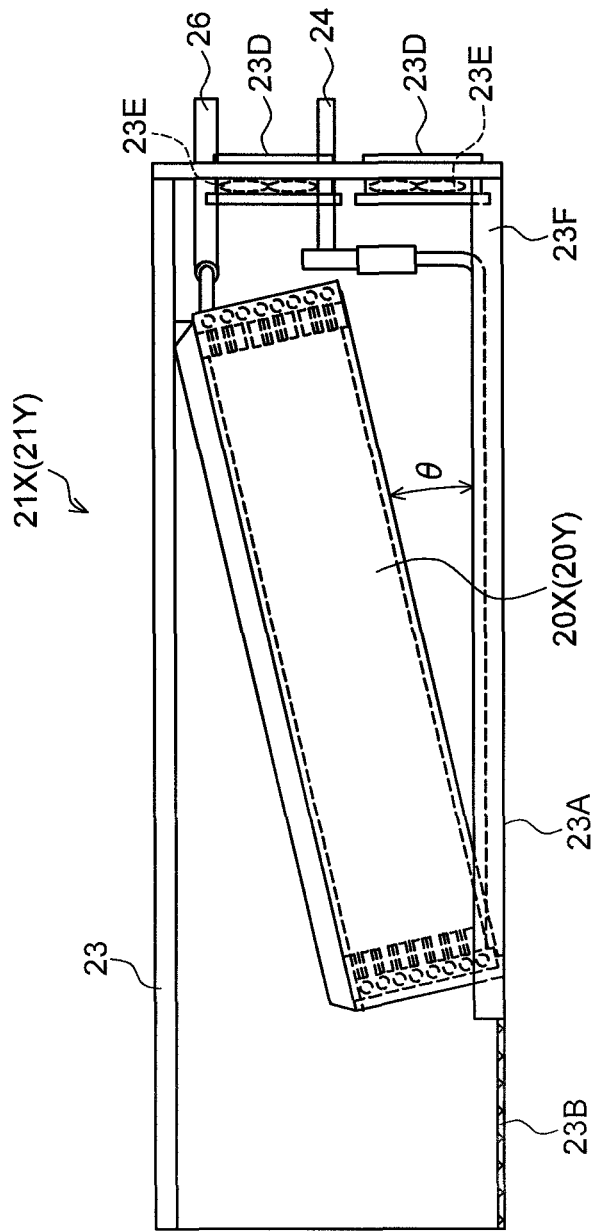
FIG. 3 is an explanatory view illustrating an internal structure of a local cooling unit.

As shown in FIG. 3, in the local cooling units 21X and 21Y, air inlet ports 23B are formed in a bottom surface 23A of a rectangular casing 23 having a cavity formed therein, and air outlet ports 23D are formed in a side surface of the casing 23 on the side of the suction space 19. In the casing 23, there are mounted evaporators 20X and 20Y for cooling ambient air by utilizing vaporization heat generated when a refrigerant liquid evaporates to vapor. Additionally, at the air outlet ports 23D, there are provided intake fans 23E for taking in the exhaust heat air of the exhaust space 17 and for blowing out air from the air outlet ports 23D.

As described later, the cooling system 10 of this embodiment employs a natural circulation method for naturally circulating refrigerant between the evaporators 20 of the local cooling units 21X and 21Y and a cooling tower 22 serving as a condenser. In order to allow the evaporators 20 to exhibit a high cooling capacity, it is preferable to increase the length of a cooling coil (not shown), which forms the evaporators 20, as much as possible, to thereby increase a heat-transfer area.

In this regard, as shown in FIG. 3, it is preferable that the air inlet ports 23B be formed in a bottom surface portion near a side surface opposite to the air outlet ports 23D, and that the evaporators 20 be disposed to be tilted at a tilt angle $\theta$ in the range of 10 to 20 degrees with respect to the bottom surface 23A of the casing 23. Thereby, the distance from the air inlet ports 23B to the air outlet ports 23D can be increased. Accordingly, a large space for heat exchange between the cooling coil and the exhaust heat air taken into the casing can be secured in the casing 23. This makes it possible to increase the length of the cooling coil. If both the air inlet ports 23B and the air outlet ports 23D are formed in the bottom surface 23A of the casing 23, a large space for heat exchange can hardly be secured.

The natural circulation method has a feature that condensation is hardly formed on the outer surfaces of the evaporators 20 as compared with a forcible circulation method in which a compressor (not shown) is provided. Thus, as in this embodiment, when the local cooling units 21X and 21Y are disposed above the server racks 13, dew condensation water is prevented from dropping on the servers 14. Further, as shown in FIG. 3, even if condensation is formed on the outer surfaces of the evaporators 20X and 20Y, the evaporators 20X and 20Y are disposed to be tilted as described above to thereby form a drainage pan 23F below the evaporators 20X and 20Y, so that drew condensation water flows down in the tilt direction and is accumulated in the drainage pan 23F.

Next, the ceiling suspension structure for the local cooling units 21X and 21Y will be described.

Figure 4:
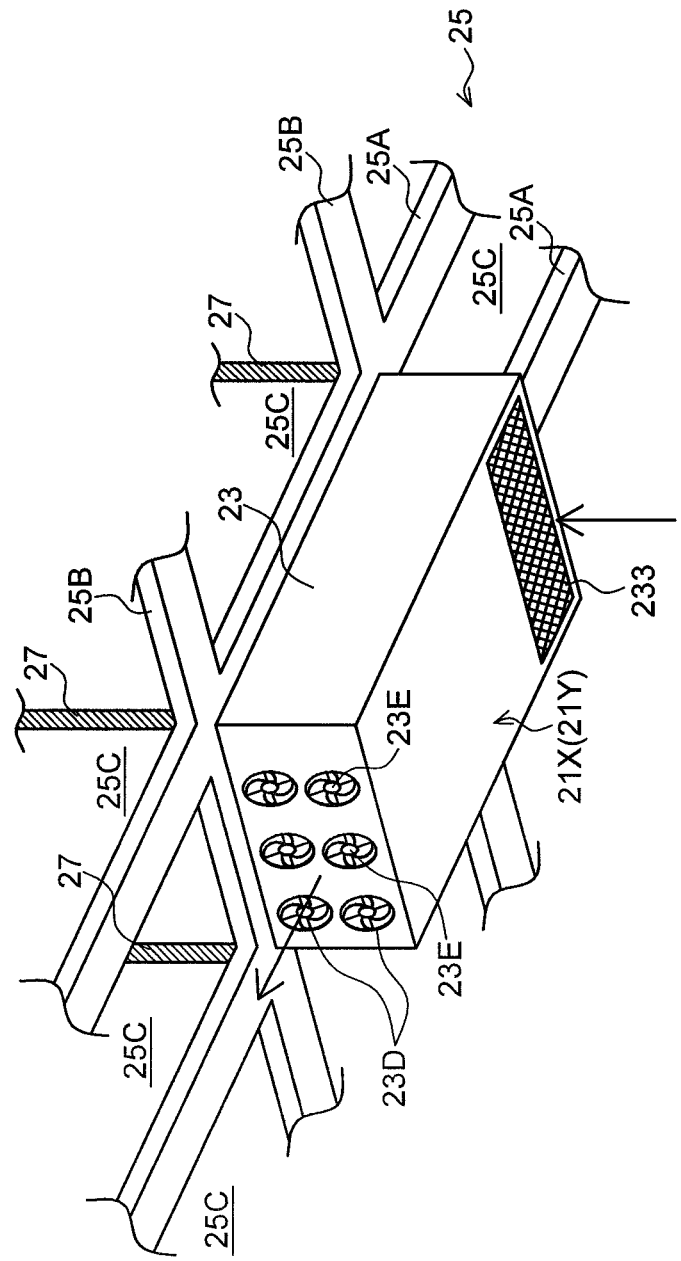
FIG. 4 is a conceptual view illustrating a support structure which supports and suspends the local cooling unit from the ceiling.

As shown in FIG. 4, the ceiling surface of each of the server rooms 12X and 12Y is formed of a lattice-shaped ceiling frame 25 in which longitudinal beams 25A and lateral beams 25B are combined in a lattice shape. The ceiling frame 25 is suspended from a ceiling slab 29 (see FIG. 1) through bolts 27. In the ceiling frame 25, the longitudinal beams 25A and the lateral beams 25B cross each other, thereby forming a number of lattice openings 25C. Upper parts of the local cooling units 21, which are formed in a rectangular shape, are detachably fit into the lattice openings 25C. The fitting structure is not particularly described. However, for example, it is possible to employ a method in which a flange part (not shown) larger than the lattice opening 25C is provided on the upper surface of each local cooling unit and the flange part is placed on the longitudinal beams 25A and the lateral beams 25B. Thus, the local cooling units 21X and 21Y are supported by the ceiling frame 25 in the state where lower parts of the local cooling units 21X and 21Y project toward the side of the server rooms 12X and 12Y.

In this embodiment, as shown in FIG. 2, the plurality of local cooling units 21X and 21Y are disposed in two rows above the exhaust space 17 along the rack rows 15. In this case, in order to prevent a gap from being formed between the local cooling units 21X and 21Y, which are disposed in two rows, it is preferable to set the width dimensions of the local cooling units 21X and 21Y so that the side surfaces of the casings on the opposite side to the air outlet ports 23D come into contact with each other. It is also preferable to set a total width W1 of the local cooling units 21X and 21Y, which are disposed in two rows, to be larger than a width W2 of the exhaust space 17 so that the upper surface of the exhaust space 17 can be sealed. In this case, it is preferable that the bottom surfaces 23A of the local cooling units 21X and 21Y partially overlap the upper surfaces of the server racks 13 as shown in FIGS. 1 and 2. Thus, the ceiling frame 25 for supporting the local cooling units 21X and 21Y is structured so that the height of the ceiling frame 25 can be adjusted by rotating the hanging bolts 27. This allows the plurality of local cooling units 21X and 21Y to be supported on the ceiling frame 25 so as to completely cover the upper surface of the exhaust space 17 formed between a pair of rack rows 15. Of the lattice openings 25C of the ceiling frame 25, the lattice opening 25C in which the local cooling unit 21 is not supported by being fit thereto is closed with a shielding plate (not shown).

Next, a refrigerant natural circulation method between the evaporators 20 and the coolant tower 22 (condenser) will be described.

As shown in FIG. 3, a cooling coil (not shown) is provided inside the evaporators 20X and 20Y which are built in the local cooling units 21X and 21Y, respectively. The cooling coil is connected to the cooling tower 22 through a liquid piping 24 in which a refrigerant liquid flows, and through a gas piping 26 in which a refrigerant gas flows.

Further, exhaust heat air of the exhaust space 17, which is taken in from the air inlet ports 23B, flows outside the cooling coil, and a refrigerant liquid flows inside the cooling coil to exchange heat. As a result, the refrigerant liquid in the cooling coil takes vaporization heat from the exhaust heat air and evaporates, thereby cooling the exhaust heat air. Thus, the blowout air blown out from the air outlet ports 23D into the suction space 19 is cooled. This makes it possible to set the temperature environment of the suction space 19 to a temperature environment necessary for the servers 14 to operate normally.

As shown in FIG. 1, the cooling tower 22 is a device which cools and condenses the refrigerant gas evaporated by the evaporators 20X and 20Y, and which is installed at a place higher than the evaporators 20X and 20Y, for example, on the roof of the building of the server rooms 12.

The evaporators 20X and 20Y and the cooling tower 22 are connected to each other with the liquid piping 24 (including branch pipes 24X and 24Y) and the gas piping 26 (including branch pipes 26X and 26Y). The upper end of the gas piping 26 is connected to the inlet of a heat exchange coil 28 in the cooling tower 22. The lower end of the gas piping 26 is branched into the branch pipes 26X and 26Y. The branch pipe 26X is connected to one end of the cooling coil of the evaporator 20X, and the branch pipe 26Y is connected to one end of the cooling coil of the evaporator 20Y. Meanwhile, the upper end of the liquid piping 24 is connected to the outlet of the heat exchange coil 28 in the cooling tower 22. The lower end of the liquid piping 24 is branched into the branch pipes 24X and 24Y. The branch pipe 24X is connected to the other end of the cooling coil of the evaporator 20X, and the branch pipe 24Y is connected to the other end of the cooling coil of the evaporator 20Y. Accordingly, the refrigerant gas evaporated by the evaporators 20X and 20Y flows upward in the gas piping 26, and is naturally delivered to the cooling tower 22 and liquefied by the cooling tower 22. After that, the liquefied refrigerant flows downward in the liquid piping 24 and is naturally delivered to the evaporators 20X and 20Y. Thus, refrigerant natural circulation is carried out. As the refrigerant to be naturally circulated, chlorofluorocarbon (CFC), or HFC (hydrofluorocarbon) as an alternative to CFC and the like can be publicly used.

In the suction spaces 19, temperature sensors 52X and 52Y are provided. Further, flow rate regulating valves 50X and 50Y for regulating the flow rate of a refrigerant liquid are respectively provided to the branch pipes 24X and 24Y of the liquid piping 24. Measured temperatures measured by the temperature sensors 52X and 52Y are input to a controller 54. The controller 54 individually controls the opening degree of the flow rate regulating valves 50X and 50Y based on the measured temperatures. This allows the refrigerant to be supplied at a flow rate appropriate for the evaporators 20X and 20Y, which have different heights between the upper floor and the lower floor, to have the same capability of cooling the exhaust heat air.

As shown in FIG. 1, the cooling tower 22 includes a cooling tower body (casing) 30 which is horizontally disposed. Further, in the cooling tower 22, an intake port 30A for taking in an external air to one end side of the cooling tower body 30 is formed, and an exhaust port 30B for exhausting an external air to the other end side is formed. The heat exchange coil 28 is provided in the cooling tower body 30. The inlet of the heat exchange coil 28 is connected to the gas piping 26 in which the refrigerant gas returning from the evaporators 20X and 20Y flows. The outlet of the heat exchange coil 28 is connected to the liquid piping 24 in which the refrigerant liquid supplied to the evaporators 20X and 20Y flows.

Further, a sprinkler 34 is provided on the side of the intake port 30A of the heat exchange coil 28, and a blower fan 36 is provided on the side of the intake port 30A with respect to the sprinkler 34. An intake external air taken in from the intake port 30A of the cooling tower body 30 is blown to the heat exchange coil 28, and the sprinkler 34 sprinkles water to the heat exchange coil 28. As a result, the refrigerant gas flowing in the heat exchange coil 28 is cooled and condensed by the external air and sprinkled water and is liquefied into a refrigerant liquid. Meanwhile, the intake external air taken into the cooling tower body 30 takes heat from the refrigerant gas flowing in the heat exchange coil 28, so that the temperature rises. Then, the intake external air is discharged as an exhaust external air from the exhaust port 30B.

Furthermore, the cooling tower 22 is provided with a control mechanism 42 for maintaining the temperature of the refrigerant liquid at the outlet of the heat exchange coil 28 constant at a predetermined value.

The control mechanism 42 includes a refrigerant liquid temperature sensor 44, an air flow-rate regulating device 36A, and a controller 46. The refrigerant liquid temperature sensor 44 measures the temperature of the refrigerant liquid at the outlet of the heat exchange coil 28. The air flow-rate regulating device 36A regulates the flow rate of air blown from the blower fan 36 to the heat exchange coil 28 by changing a rotating speed of the blower fan 36. The controller 46 controls the air flow-rate regulating device 36A based on the temperature measured by the refrigerant liquid temperature sensor 44. As the controller 46, a controller 54 may also be used, and the controller 46 for the cooling tower 22 may be separately provided as shown in FIG. 1.

According to the cooling system 10 structured as described above, the exhaust heat air of high temperature (for example, 45° C.) exhausted from the servers 14, which are stacked in layers on the server racks 13, is exhausted to the exhaust space 17 formed between a pair of rack rows 15. The exhaust heat air exhausted to the exhaust space 17 is taken into the casing 23 from the intake ports 23B of the plurality of local cooling units 21 which are disposed above the exhaust space 17. Further, the refrigerant liquid is evaporated by the evaporators 20X and 20Y which are built in the local cooling units 21, thereby cooling the exhaust heat air and blowing out the cooled air (for example, 25° C.) to the suction space 19 from the air outlet ports 23D.

Meanwhile, in the cooling tower 22, the refrigerant gas from the evaporators 20X and 20Y is cooled and condensed to be liquefied, so that the liquefied refrigerant liquid flows down to the evaporators 20X and 20Y by gravity. Thus, natural circulation of refrigerant is formed. The controller 54 monitors the air temperature measured by the temperature sensors 52X and 52Y, or the air temperature of the suction space 19 after the exhaust heat air is cooled by the evaporators 20X and 20Y in the local cooling units 21. Then, the controller 54 controls the flow rate regulating valves 50X and 50Y so that the air temperature of the suction space 19 reaches a temperature suitable for the operation environment of the servers 14, and regulates the flow rate of the refrigerant gas flowing in the liquid piping 24. By the valve control, the temperature of the blown air cooled by the evaporators 20X and 20Y is properly controlled.

In the cooling system 10 as described above, the local cooling units 21 are suspended from the ceiling frame 25, so that the entire floor surfaces 11 of the server rooms 12X and 12Y can be effectively used as a space for installing the server racks 13. Additionally, instead of intensively cooling the overall server rooms 12X and 12Y by using a large cooling device with a large capacity, a plurality of exhaust spaces 17 are formed and the plurality of exhaust spaces 17 are locally cooled by the local cooling units 21, thereby downsizing the intake fans 23E. Consequently, the fan operation power can be drastically reduced, which contributes to energy saving.

Further, as in this embodiment, in the case where the local cooling units 21X and 21Y, in which the evaporators 20X and 20Y are built in, are disposed above the server racks 13, if condensation is formed on the evaporators 20X and 20Y and dew condensation water drops on the servers 14, a server failure occurs. However, in the embodiment of the present invention, since the refrigerant is circulated by the natural circulation method, condensation is hardly formed on the evaporators 20 as compared with the forcible circulation method in which a compressor is used. Furthermore, as a countermeasure for condensation to be formed on the evaporators 20X and 20Y, the drainage pan 23F is provided below the evaporators 20X and 20Y, which are tilted, as shown in FIG. 3, thereby preventing dew condensation water from dropping on the servers 14. Moreover, the evaporators 20X and 20Y are tilted and disposed in the casings 23 of the local cooling units 21X and 21Y so as to increase the length of the cooling coil forming the evaporators 20X and 20Y. Therefore, the cooling capability of the evaporators 20X and 20Y can be enhanced.

Note that in this embodiment, the server 14 is illustrated as an example of an electronic device. Alternatively, for example, general cooling systems for electronic devices which require precise temperature control, such as a semiconductor manufacturing device, and from which a large amount of heat is generated can be applied.

What is claimed is:

1. A cooling system for at least one electric device, comprising:
 a first rack row and a second rack row, in which a plurality of racks are arranged, wherein each of the plurality of racks is configured to house an electric device including a first fan, and each of the plurality of racks has both an air suction port formed in a front surface of the rack and an air exhaust port formed in a rear surface of the rack, and wherein the first rack row and the second rack row are disposed such that their respective air exhaust ports oppose each other, and a gap with a predetermined size is interposed therebetween;
 a plurality of local cooling units, each configured to cool a rack row, wherein at least one first local cooling unit and second cooling unit, serving as an opposing pair of local cooling units, of the plurality of local cooling units, are disposed above the first rack row and the second rack row, respectively, in an opposing manner, wherein the gap with the predetermined size is covered by a combination of the first local cooling unit disposed above the first rack row and the second local cooling unit disposed above the second rack row, and wherein each of the first local cooling unit and the second local cooling unit includes:
  a housing having a cavity formed in the housing;
  an air inlet port provided in a bottom surface of the housing and open to the predetermined gap, to take in exhaust heat air from the rack row, via the predetermined gap;
  an evaporator provided in the housing, and configured to evaporate a refrigerant by heat exchange with air sucked in from the air inlet port, to cool the air, the refrigerant passing through an inside of the evaporator;
  an air outlet port provided in a side surface of the housing, and configured to exhaust the air cooled by the evaporator to a rack row side having the air suction ports of the racks; and
  a second fan configured to move the air from the air inlet port to the air outlet port;
  wherein the first local cooling unit exhausts air cooled by the evaporator to the rack row side of the first rack row, having the air suction ports of the racks, and the second local cooling unit exhausts air cooled by the evaporator to the rack row side of the second rack row, having the air suction ports of the racks;
 a cooling tower and/or condenser, disposed above the plurality of local cooling units;
 a gas piping configured to transport a refrigerant, which has been evaporated in an evaporator, to the cooling tower and/or condenser; and
 a liquid piping configured to transport the refrigerant, which has been condensed in the cooling tower and/or condenser, to the evaporator;
 wherein the refrigerant is naturally circulated.

2. The cooling system according to claim 1, wherein the evaporator is disposed to be tilted so that the evaporator gradually increases in height toward the air outlet port from the air inlet port.

3. The cooling system according to claim 1, further comprising: a drainage pan formed below the evaporator.

4. The cooling system according to claim 2, further comprising: a drainage pan formed below the evaporator.

5. The cooling system according to claim 1, wherein
a device room housing the cooling system includes a lattice ceiling, and
the local cooling units are mounted to the lattice ceiling.

6. The cooling system according to claim 2, wherein
a device room housing the cooling system includes a lattice ceiling, and
the local cooling units are mounted to the lattice ceiling.

7. The cooling system according to claim 3, wherein
a device room housing the cooling system includes a lattice ceiling, and
the local cooling units are mounted to the lattice ceiling.

8. A cooling system for at least one electric device, comprising:
a first rack row and a second rack row, in which a plurality of racks are arranged, wherein each of the plurality of racks is configured to house an electric device including a first fan, and each of the plurality of racks has both an air suction port formed in one side of the rack and an air exhaust port formed in another side of the rack opposite to the one side, and wherein the first rack row and the second rack row are disposed such that their respective air exhaust ports oppose each other, and a gap with a predetermined size is interposed therebetween;
a plurality of local cooling units, each configured to cool a rack row, wherein at least one first local cooling unit and second cooling unit, serving as an opposing pair of local cooling units, of the plurality of local cooling units, are disposed above the first rack row and the second rack row, respectively, in an opposing manner, wherein the gap with the predetermined size is covered by a combination of the first local cooling unit disposed above the first rack row and the second local cooling unit disposed above the second rack row, and wherein each of the first local cooling unit and the second local cooling unit includes:
a housing having a cavity formed in the housing;
an air inlet port provided in a bottom surface of the housing and open to the predetermined gap, to take in exhaust heat air from the rack row, via the predetermined gap;
an evaporator provided in the housing, and configured to evaporate a refrigerant by heat exchange with air sucked in from the air inlet port, to cool the air, the refrigerant passing through an inside of the evaporator;
an air outlet port provided in a side surface of the housing, and configured to exhaust the air cooled by the evaporator to a rack row side having the air suction ports of the racks; and
a second fan configured to move the air from the air inlet port to the air outlet port;
wherein the first local cooling unit exhausts air cooled by the evaporator to the rack row side of the first rack row, having the air suction ports of the racks, and the second local cooling unit exhausts air cooled by the evaporator to the rack row side of the second rack row, having the air suction ports of the racks;
a cooling tower and/or condenser, disposed above the plurality of local cooling units;
a gas piping configured to transport a refrigerant, which has been evaporated in an evaporator, to the cooling tower and/or condenser; and
a liquid piping configured to transport the refrigerant, which has been condensed in the cooling tower and/or condenser, to the evaporator;
wherein the refrigerant is naturally circulated via gravity.

* * * * *